United States Patent [19]

Ekin

[11] 4,044,298
[45] Aug. 23, 1977

[54] SUPER CONDUCTING DEVICE WITH MINIMAL PINNING

[76] Inventor: John Walter Ekin, 1345 Drexel St., Boulder, Colo. 80303

[21] Appl. No.: 562,295

[22] Filed: Mar. 26, 1975

[51] Int. Cl.$^2$ .......................... G05F 7/00; H01F 10/00
[52] U.S. Cl. .................................. 323/44 F; 363/14; 335/216; 336/DIG. 1
[58] Field of Search ............. 323/44, 94; 336/DIG. 1; 321/8 CD; 335/216; 330/62

[56] References Cited

U.S. PATENT DOCUMENTS

| | | | |
|---|---|---|---|
| 3,048,707 | 8/1962 | Nyberg | 335/216 |
| 3,394,317 | 7/1968 | Giaever | 330/62 |
| 3,629,690 | 12/1971 | Massar | 323/44 F |
| 3,790,880 | 2/1974 | Solomon | 323/44 F |

OTHER PUBLICATIONS

Physical Review B vol. 9, No. 3 Feb. 1, 1974, "Magnetic Couplings in Superposed Type II S.C. Films" by Ekin, Serin and Clem, pp. 912–917.

*Primary Examiner*—Gerald Goldberg
*Attorney, Agent, or Firm*—O'Rourke and Harris

[57] ABSTRACT

Type II superconductive materials having greatly diminished vortex pinning as a result of maintaining the ratio of the average scale of structural disorder of the materials to vortex core size to not greater than about 120% of the minimum such ratio, superconductive devices utilizing such materials, and a method for producing such materials.

6 Claims, 8 Drawing Figures

SUPER CONDUCTING DEVICE WITH MINIMAL PINNING

STATEMENT OF GOVERNMENT INTEREST

The Government of the United States of America has a nonexclusive, irrevocable, royalty-free license in the invention described herein with power to grant licenses for all governmental purposes.

BACKGROUND OF THE INVENTION

1. Field of the Invention

This invention relates to a method for minimizing bulk vortex pinning in granular Type II superconductors, and to the resulting superconductors. The method has been applied to a preferred superconducting granular aluminum system to determine the optimum fabrication conditions for minimizing vortex-pinning in this material. This invention further relates to the application of these low pinning materials to superconducting electronic devices which depend on vortex motion for their operation, permitting in particular the construction of a unity-coupling direct current transformer which is free of heating instabilities and capable of distortion-free operation over a wide dynamic range of operating conditions.

2. Description of the Prior Art

It is known in the art that a number of Type II superconducting devices depend on vortex motion for their operation, including for example thin-film microbridge applications such as quantum interference magnetometers and frequency mixers, as well as magnetic flux coupled devices such as the direct current transformer originally disclosed and claimed in U.S. Pat. No. 3,394,317 issued to I. Giaever. A primary problem, however, with such devices is that the Type II superconducting materials from which they are usually fabricated have vortex pinning forces that are typically very large. These large vortex pinning forces in turn necessitate operation of such devices at very high current densities. In the case of thin film microbridge applications this can lead to heating instabilities which drive the superconducting film into the normal state. In the case of the direct current transformer, as will be explained further, this restricts operation of the device to a very limited current range and necessitates operation of the device under conditions wherein the transformer's secondary voltage is a non linear function of the primary voltage.

SUMMARY OF THE INVENTION

Therefore, it is an object of this invention to provide a method for minimizing vortex pinning in Type II superconducting materials and to demonstrate the application of these materials in the construction of superconducting devices such as those mentioned above. It is a further object of this invention to provide Type II superconducting materials having low vortex pinning.

Briefly, the minimization method consists of properly sizing the average scale of structural disorder occurring in the superconductor. In particular, bulk vortex pinning may be minimized by minimizing the material's ratio of average defect size to vortex core size. The smaller this ratio, the smaller the effects of bulk pinning and the smaller the resulting critical current density.

The method applies to any Type II superconducting material where the average defect size can be made less than the vortex core dimension. The method has been tested specifically for the granular aluminum system where it is predicted and shown experimentally that the minimum vortex pinning condition in this system is obtained by doping pure aluminum films with oxygen to the point where the normal state resistivity of the material is about $10\mu\Omega$ cm.

The average scale of structural disorder such as crystalline grain size in polycrystalline materials can be controlled by conventional means during the production of such materials. However, the vortex core size of the materials also decreases in size as the grain size decreases, due to shortening of the material's electronic mean free path. As a result of the varying relationship of these two properties, it has been found that a minimum ratio of the properties may be determined at constant reduced temperature. While a preferred range exists through 120% or less of the minimum ratio, worthwhile results may be obtained for ratio values less than approximately 0.05.

As one application of these low-pinning materials, a unity-coupling dc transformer has been constructed and tested. The device consists of two optimized superconducting granular aluminum films separated by a thin insulating layer, the assembly being situated in a magnetic field and cooled below the transition temperature of the superconductors. If a dc voltage is applied to one of the films, a dc voltage will under certain conditions be induced in the second film. The unity-coupling dc transformer described here has an important advantage over previously constructed transformers in that the large reduction in pinning forces has permitted the elimination of heating instabilities as well as the achievement of a wide range of unity coupling wherein the primary and secondary voltages track each other in a 1 to 1 relationship, independent of temperature, magnetic field, and signal strength for wide ranging values of these parameters. This permits linear, distortion-free transformation of dc and audio-frequency signals. It also eliminates drifts in the output signal caused by temperature and magnetic field variations.

Additional objects, features and advantages of the present invention will become apparent to those skilled in the art from the following detailed description and the attached drawings.

DETAILED DESCRIPTION OF THE INVENTION

Figure 1:
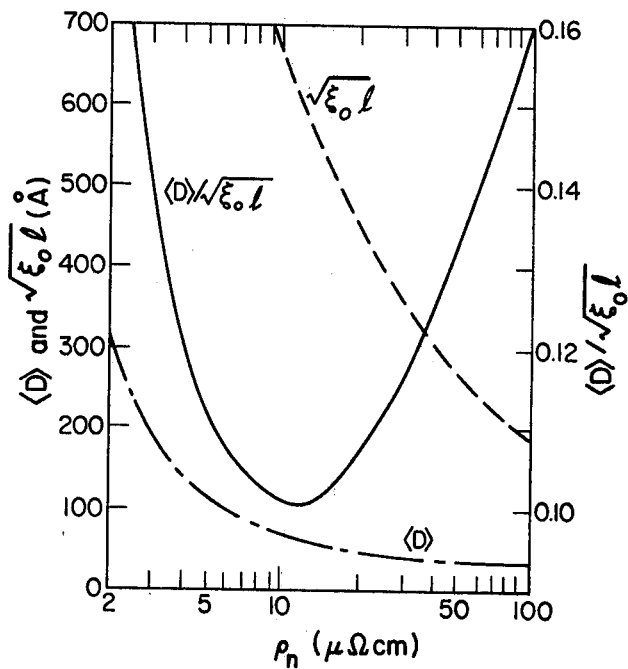
FIG. 1 shows the optimization method as applied to the granular aluminum system.

One characteristic of Type II superconductors is that they can exist in a so-called Mixed state wherein they are neither a perfect superconductor nor a normal conductor. A perfect superconductor placed in a magnetic field exhibits complete diamagnetism, that is it will completely exclude lines of magnetic flux from its interior. In the normal state on the other hand, the lines of flux of an applied magnetic field completely permeate the material. The Mixed state is an intermediate condition of the superconductor existing over certain ranges of applied magnetic field, transport current and temperature wherein bundles of flux lines of a magnetic field to which the material is exposed pass through the material in discrete and limited regions. In Type II superconductors these regions are called vortices and the amount of magnetic flux passing through each is fixed and equal to one flux quantum.

In the presence of a current these vortices will experience a Lorentz force acting to make them move in a direction at right angles to the applied current direction and magnetic field direction. However, crystallographic defects in the superconductor will tend to pin the vortices in place, preventing them from moving. If the Lorentz force resulting from an applied dc transport current is less than the pinning forces acting on a vortex, no net vortex motion will occur and the vortex will be pinned in place. On the other hand if the current-induced Lorentz force is greater than the pinning forces, continuous translational movement of the vortex will occur, although even this movement will be inhibited by pinning forces in the material. These vortices, when they move create an electric field and will induce a dc voltage in the superconductor.

Relatively large vortex pinning forces occur in most Type II superconducting materials. The larger the pinning forces, the larger the current density needed to induce vortex motion. The current density at which vortex motion first commences is called the lower critical current density $J_{cl}$. In most conventional Type II superconductors such as thin-film Sn or In-Pb alloys, $J_{cl}$ is relatively large, typically $10^5$–$10^6$ A/cm at low fields and temperatures. In devices which depend on vortex motion for their operation like the dc transformer system, such large $J_{cl}$ values set a very high current density below which the device will not function. Furthermore, when vortex motion finally does commence at high current densities, the power dissipated in the superconductor is often so great it generates heating instabilities which drive the entire superconductor into the normal state. In other applications involving thin film microbridges for example, the high critical current density required for vortex motion at low temperatures necessitates junction dimensions which are so small as to prohibit their fabrication.

I have developed a method for minimizing the critical current densities occurring in Type II superconducting materials. By virtue of this minimization technique, it is possible to utilize fabrication conditions wherein critical current densities may be obtained in Type II superconductors which are many times smaller than those described above. By way of example, I have applied this method to the granular aluminum system to determine the optimum fabrication conditions for reducing the critical current densities occurring in these materials to levels which are 2 to 3 orders of magnitude lower than the $J_{cl}$ values described above for conventional Type II superconductors, under comparable magnetic field and temperature conditions.

The minimization method comprises properly sizing the average scale of structural disorder, that is the size of defects occurring in the superconductor, such as crystallite grains, dislocations and other inhomogeneities in the material causing vortex pinning. In particular, vortex pinning may be minimized by minimizing the ratio $<D>/\xi$ at constant reduced temperature $1 - T/T_c$, where $<D>$ is the average size of defects occurring in the material, $\xi$ is the vortex core dimension, T is the temperature, and $T_c$ is the superconductor's critical temperature. The smaller this ratio, the smaller the effects of bulk pinning and the smaller the resulting critical current density.

The method applies only for the case where the average defect size $<D>$ is less than the vortex core dimension $\xi$. Thus qualitatively it may be considered that each vortex spans many defects and the net pinning potential acting on each vortex is reduced to an average over the ensemble of inhomogenieties it covers. The smaller this ratio, the greater the averaging effect and the smaller the net pinning force.

I have reduced this minimization method to practice specifically for the granular aluminum system, but the technique outlined above for minimizing pinning is generally applicable to any Type II superconducting material where the average defect size can be made smaller than the vortex core dimension.

FIG. 1 of the drawing illustrates the minimization method as applied to the granular aluminum system. For this material $<D>$ is identified with the average grain size occurring in the film and will be a function of the conditions under which the film is prepared. In particular, the films are made by evaporating aluminum in the presence of a partial pressure of oxygen onto a smooth substrate, made of fire-polished glass for example. The lower the evaporation rate and the higher the partial pressure of oxygen, the smaller the resulting average grain size $<D>$. The distribution of grain sizes in granular Al has been measured by Deutscher et al as a function of the film's normal state resistivity at 4° K, $\rho_n$, and is shown in FIG. 1 as a long-and-short-dashed curve. [For a further discussion of these grain-size measurements, reference may be had to G. Deutscher et al, J. Low Temp. Phys. 10, 231 (1973)]. The size of the vortex core on the other hand is determined by the temperature dependent coherence length. For the case of granular aluminum, this length may be approximated by its dirty-limit evaluation in the Ginzburg-Landau theory, which near $T_c$ is given by:

$$\xi = 0.85 \sqrt{\xi_o l}(1 - T/T_c)^{-1/2}. \qquad 1.$$

Here $\xi_o$ is the film's BCS coherence length and $l$ is the film's electronic mean free path. From equation (1) it is seen that $\xi$ is proportional to the factor $\sqrt{\xi_o l}$ for constant reduced temperature $1 - T/T_c$. A plot of the factor $\xi\sqrt{\xi_o l}$ as a function of $\rho_n$ is shown as a long-dashed curve in FIG. 1. Application of the above minimization technique to the granular aluminum system thus involves, to first order, preparing films where the ratio of these two curves $<D>\sqrt{\xi_o l}$ is a minimum. The solid curve in FIG. 1 is a plot of this ratio as a function of $\rho_n$. Note that this ratio passes through a minimum for $\rho_{n\mu}$ 10 $\mu\Omega$cm. Thus we would expect the critical current density in the granular aluminum system to pass through a minimum as a function of oxygen-doping level, with the lowest critical current densities occurring in those films prepared to have a normal state resistivity of about 10μΩ cm.

Figure 2:
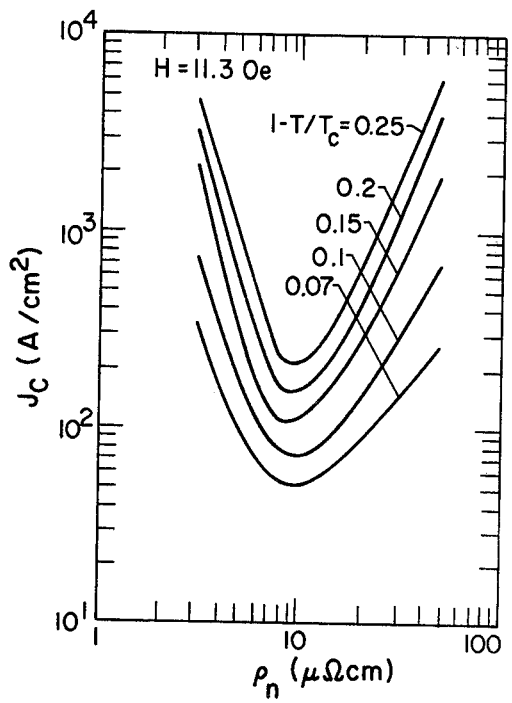
FIG. 2 shows the experimentally measured relationship between the critical current density and oxygen doping level for the granular aluminum system.

FIG. 2 of the drawing shows critical current density data measured on a series of granular aluminum films prepared with varying oxygen doping levels. (The results were obtained on films evaporated on cylindrical substrates designed to eliminate any complications of edge pinning effects. For further experimental details, reference may be had to J. W. Ekin, Physical Review 12 (1975) to be published.) The figure shows in particular the critical current density $J_{cl}$ plotted as a function of each sample's normal state resistivity $\rho_n$. Each curve was obtained at a constant reduced temperature 1 - $T/T_c$ and at a constant applied magnetic field of 11.3 Oersted.

The important point to note in FIG. 2 is that the critical current does indeed pass through a minimum as the normal state resistivity is increased, corroborating the predicted scaling of $J_{cl}$ with the ratio $<D> \sqrt{\xi l}$. Moreover, the minimum value of $J_{cl}$ is observed to occur in the predicted range near 10μΩcm. Note the sharpness of this minimum; on either side of the optimum oxygen doping level the critical current density increases by several orders of magnitude as $\rho_n$ is varied by only half an order of magnitude.

It may also be seen from the curves in FIG. 2 and using equation (1) that the ratio of $<D>$ to $\xi$ exceeds a value of approximately 0.05 for all the curves at current density levels above $10^3 A/cm^2$. Thus there is a consistent limit on the ratio of $<D>$ to $\xi$ below which relatively small critical current densities are obtained.

Optimized granular aluminum films with a $\rho_n$ of about 10μΩ cm can be prepared by evaporating aluminum at a rate of about 10 A/sec in a partial pressure of oxygen of about $10^{-5}$ torr over a source-to-substrate distance of about 15 cm. These films are extremely stable; films on the order of 100A thick have been observed to exhibit no change in their critical current properties due to either thermal shock or prolonged storage in air at room temperature.

Figure 3:
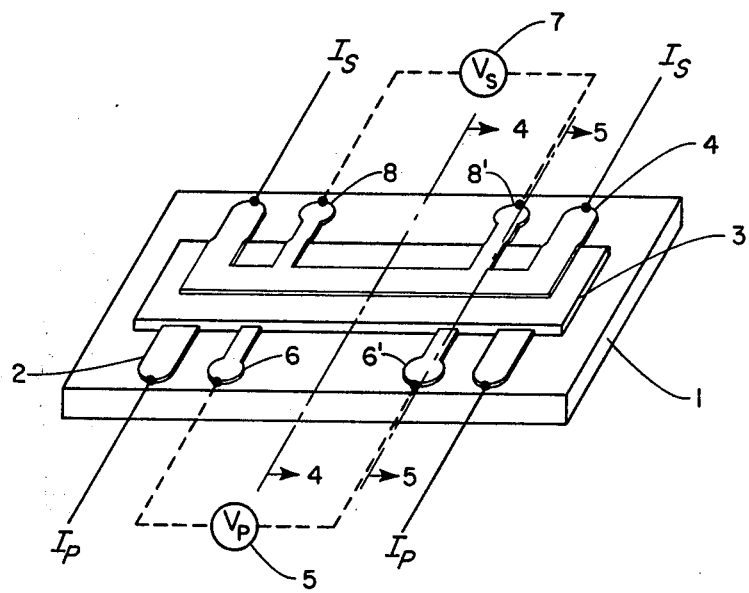
FIG. 3 shows a typical geometry for the transformer of this invention.
Figure 4:
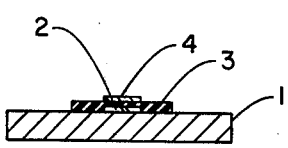
FIG. 4 shows a cross-sectional view of the device of FIG. 3.
Figure 5:
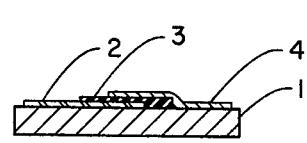
FIG. 5 shows a second cross-sectional view of the device of FIG. 3.

FIG. 3 of the drawing shows one particular application of these low pinning materials in the construction of a unity coupling dc transformer. Crossectional views taken along lines 4-4 and 5-5 in FIG. 3 are shown in FIGS. 4 and 5 respectively. As seen in FIGS. 3, 4, and 5, the transformer consists of a fire-polished glass substrate 1 on which is deposited in serial order a first superconducting layer 2 composed of a low-pinning material as described above, typically 100A -10,000A thick; an insulating layer 3 made of SiO for example which is typically about 100A thick, but greater than 30A thick to preclude significant quantum mechanical tunnelling therethrough; and a second low-pinning superconducting layer 4 similar in thickness and width to the first superconducting layer 2. A magnetic field applied perpendicular to the surface of the three-film sandwich may be used to establish in both films an array of vortices which magnetically couple together through the thin insulating layer. Alternatively the self field of the applied primary current $I_p$ may be used to generate this vortex array. When a current of sufficient magnitude is passed through one of the superconducting films, say the lower film 2, the vortices in film 2 will be depinned and start to move. The motion of the vortices in film 2 (which hereafter will be referred to as the primary) induces a dc voltage along its length which may be detected with a voltmeter 5 at terminals 6 and 6'. If the magnetic coupling with the superposed secondary vortex lattice in film 4 is strong enough, and if the vortex pinning forces are weak enough, the secondary vortex lattice will be dragged along by the motion of the primary vortex lattice and a dc voltage will appear across the secondary film which may be measured with a secondary voltmeter 7 at terminals 8 and 8'. Thus we have in effect a superconducting dc transformer wherein a dc voltage across the primary film magnetically induces a dc voltage in an electrically insulated secondary. [For further discussion, reference may be had to J. W. Ekin, B. Serin, and J. R. Clem, Physical Review 9, 912 (1974).] The transformer will perform the same functions as any ordinary electrical transformer for a zero frequency, ie, direct current, where ordinary transformers cannot be used. The transformer will also work at audio frequencies up to the point where capacitive coupling between the two superposed superconducting layers significantly lowers their isolation impedance.

Note from the above description that the onset of transformer action is determined by the magnitude of the pinning forces in the superconducting films. In transformers made of conventional Type II superconducting materials, the pinning forces are so large that the coupled-vortex motion has been observed only at high current densities where heating-instability problems occur. Under such conditions, the applied primary current is so large that it drives the primary film normal, causing its resistance to jump to its normal state value. The Joule heating of the primary then it turn drives the secondary normal, causing the secondary voltage to drop abruptly to zero (in the absence of applied secondary current). Thus with such materials heating instabilities and large pinning forces restrict operation of the transformer to a limited range of very high current densities. Furthermore the large pinning forces in conventional materials cause slippage between the vortex structures in the primary and secondary films. This results in the secondary voltage lagging behind the primary voltage. The secondary voltage is then a nonlinear function of the primary voltage, inherently unstable, and sensitive to temperature and magnetic field drift.

Transformers constructed from optimized granular aluminum films on the other hand operate at current density levels several orders of magnitude below the current density where heating instabilities occur. In addition there is a wide operating range where unity coupling takes place between the primary and secondary vortex structures. That is, the primary and secondary flux structures are locked together, moving in unison; the secondary voltage is a linear function of the primary voltage, inherently stable, and independent of temperature, magnetic field, and signal strength for wide ranging values of these parameters. This permits linear, distortion-free transformation of dc and audio-frequency signals. It also eliminates drifts in the output signal caused by temperature and magnetic field variations. Thus, for example, the dc temperature coeficient of the device is zero over a substantial range of temperatures.

Figure 6:
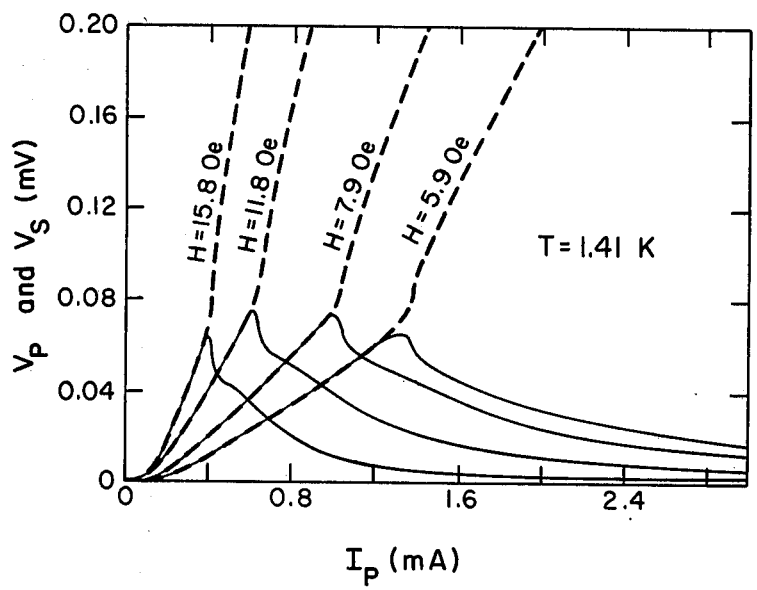
FIG. 6 shows a graph illustrating some voltage-current characteristics of the device of FIG. 3.

FIG. 6 illustrates typical voltage-current characteristics obtained by passing a direct current $I_p$ through the primary of a transformer of the type shown in FIG. 3 constructed with optimized superconducting granular aluminum films. The dashed curves shown the primary voltage $V_p$ as a function of $I_p$, and the solid curves represent the secondary voltage $V_s$ as a function of $I_p$. The important point to note is that $V_p$ and $V_s$ track each other in a 1:1 relationship over a substantial range of current and applied magnetic field. Similar data have been obtained at other temperatures below the critical temperature. When the applied primary current becomes too great, eventually slippage between the primary and secondary flux lattices commences. The primary and secondary voltages then no longer track each other and, as may be seen in FIG. 6, there is a distinct break in the curves. This, however, is not caused by heating instabilities as in transformers constructed from conventional Type II superconducting materials. Rather it is caused by the smallness of the coupling force in the particular transformer from which these voltage-current characteristics were generated. In higher-power transformers constructed to have a large coupling force, I have observed unity coupling persisting to current density levels several orders of magnitude larger than those shown in FIG. 6. For a discussion of procedures for optimizing the coupling force in the dc transformer, reference may be had to J. W. Ekin and John R. Clem, Physical Review 11 (1975).

Figure 7:
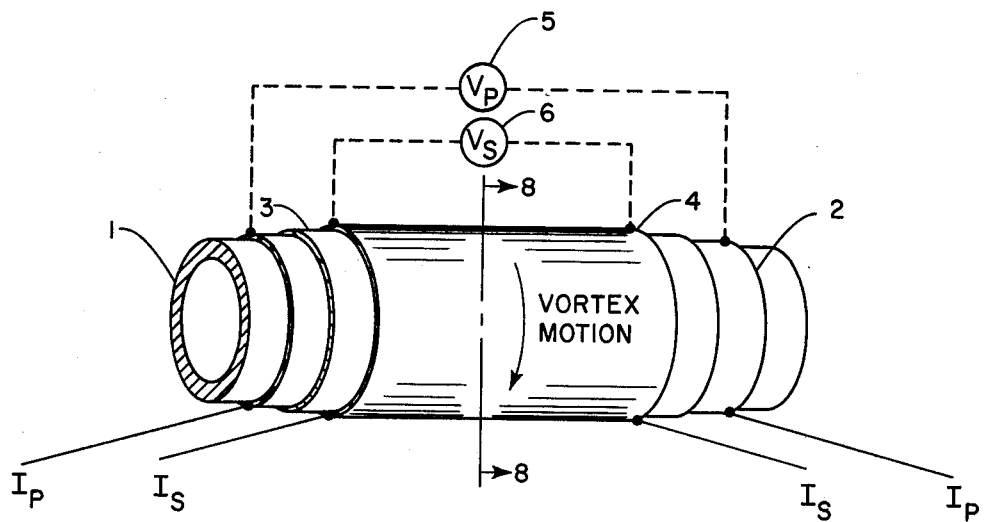
FIG. 7 shows a diagrammatic view of an extended-range dc transformer.
Figure 8:
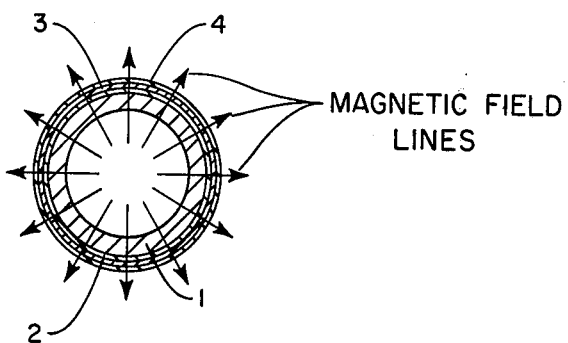
FIG. 8 shows a cross-sectional view of the device of FIG. 7.

FIG. 7 of the drawing illustrates an extended-operating range dc transformer. Dc transformers of the type shown in FIG. 3 are limited from operating at even lower signal levels by edge-pinning effects. I have observed that in optimized films such as those described for the granular aluminum system, bulk pinning can be reduced to such an extent that vortex pinning at the film edges plays a dominant role in determining $J_{cl}$. (Further experimental details are contained in the reference cited above: J. W. Ekin, Physical Review 12 (1975) to be published.) A wider dynamic range of transformer operation may thus be obtained by simply eliminating the edges. One method for accomplishing this is to wrap the planar structure of FIG. 3 into a cylindrical geometry with the magnetic field applied radially. Thus is further illustrated in FIG. 8 which is a crossectional view taken along line 8—8 in FIG. 7. The extended-range transformer shown in FIGS. 7 and 8 consists of a fire-polished cylindrical glass substrate 1 on which is deposited in serial order a first superconducting cylindrical layer 2 composed of a low pinning material, a cylindrical insulating layer 3, and a second low-pinning superconducting cylindrical layer 4. An approximately radial magnetic field is applied perpendicular to the surface of the cylindrical arrangement inducing in each superconducting film an array of vortices. The primary current $I_p$ is applied axially to one of the superconducting films, say the lower film 2, which induces continuously circulating vortex currents around the circumference of film 2. Magnetic coupling can occur between superconducting layers 2 and 4 as in the flat-film case, inducing the vortex array in film 4 to move, and thereby generating a voltage along the length of the secondary film 4. Dc voltages developed along the primary and secondary may be detected with voltmeters 5 and 6 respectively. The important point is that in this geometry the vortex currents are continuous, never intersecting any edges. This results in a significant reduction in critical-current density and increased range of operation.

Other configurations and applications of low-pinning superconducting materials to known magnetically-coupled devices will be readily apparent to those skilled in the art. For example, dc voltages and impendances may be stepped up or stepped down. Memory devices may also be formed by inducing persistent currents in a closed-loop transformer secondary as discussed in the aforementioned patent issued to I. Giaever. In all such applications it is noted that the devices are thin film systems which are amenable to integrated circuit construction.

In the foregoing I have described only a few applications of low pinning Type II superconducting materials to magnetically-coupled devices. Other applications include devices utilizing superconducting microbridges for magnetometry, geothermal prospecting, noise theometry, etc., as well as certain parametric amplifiers, detectors and mixers made from superconducting films. In short, the applications for the abovedescribed method of fabricating low-pinning Type II superconducting materials are in any device or system which depends on vortex motion for its operation.

Although only several embodiments of the present invention have been illustrated and described, it is anticipated that various changes and modifications will be apparent to those skilled in the art, and that such changes may be made without departing from the scope of the invention as defined by the following claims.

What I claim as new and desire to secure by Letters Patent of the U.S. is:

1. A device comprising a Type II superconductive material and means for inducing movement of vortices in the superconductive material positioned adjacent the superconductive material, the superconductive material having a ratio at constant reduced temperature of $<D>$, the average scale of structural disorder in such material, to $\xi$, the vortex core size, less than 120% of the minimum obtainable such ratio, but less than unity.

2. A device as set forth in claim 1 in which the device is a dc transformer, the superconductive material is in the form of a first film of such material, and the means for inducing vortex movement in a second film of such material separated from the first film by an insulating film of at least 30A thickness.

3. A dc transformer as set forth in claim 2 in which the first, second and insulating films are concentric cylinders.

4. A device comprising a Type II superconductive material and means for inducing movement of vortices in the superconductive material positioned adjacent the superconductive material, the superconductive material having a ratio of $<D>$, the average scale of structural disorder in such material, to $\xi$, the vortex core size, less than about 0.05 at a reduced temperature value of greater than 0.1.

5. A device as set forth in claim 4 in which the device is a dc transformer, the superconductive material is in the form of a first film of such material, and the means for inducing vortex movement is a second film of such material separated from the first film by an insulating film of at least 30A thickness.

6. A dc transformer as set forth in claim 5 in which the first, second and insulating films are concentric cylinders.

* * * * *

UNITED STATES PATENT OFFICE
CERTIFICATE OF CORRECTION

Patent No. 4,044,298   Dated August 23, 1977

Inventor(s)  John Walter Ekin

It is certified that error appears in the above-identified patent and that said Letters Patent are hereby corrected as shown below:

Column 3, lines 42, 44, and 47 "$J_c l$" should be "$J_{cl}$"

Column 4, line 1, "$J_c l$" should be "$J_{cl}$"

Column 4, line 59 "$\xi \sqrt{\cdot l}$" should be "$\sqrt{\xi \cdot l}$"

Column 4, line 63 "$\langle D \rangle \sqrt{\xi \cdot l}$" should be "$\langle D \rangle / \sqrt{\xi \cdot l}$"

Column 4, line 65 "$\rho_n \mu 10 \mu \Omega cm$" should be "$\rho_n \approx 10 \mu \Omega cm$"

Column 5, line 20 "$J_c l$" should be "$J_{cl}$"

Column 5, line 20 "$\langle D \rangle \sqrt{\xi \cdot l}$" should be "$\langle D \rangle / \sqrt{\xi \cdot l}$"

Column 5, line 21 "$J_c l$" should be "$J_{cl}$"

Column 5, line 44 "unity coupling " should be "unity-coupling"

UNITED STATES PATENT OFFICE
CERTIFICATE OF CORRECTION

Patent No. 4,044,298        Dated August 23, 1977

Inventor(s) John Walter Ekin

It is certified that error appears in the above-identified patent and that said Letters Patent are hereby corrected as shown below:

Column 6, line 31 "it" should be "in"
Column 6, line 60 "coeficient" should be "coefficient"
Column 6, line 67 "shown" should be "show"
Column 7, line 25 "operatingrange" should be "operating-range"
Column 7, line 31 "$J_{cl}$" should be "$J_{c1}$"

Column 8, line 2 "impendances" should be "impedances"
Column 8, line 17 "above described" should be "above-described"

*Signed and Sealed this*

*Twenty-fourth* Day of *January 1978*

[SEAL]

Attest:

RUTH C. MASON
*Attesting Officer*

LUTRELLE F. PARKER
*Acting Commissioner of Patents and Trademarks*